United States Patent
Bazylenko

(10) Patent No.: US 6,727,110 B2
(45) Date of Patent: Apr. 27, 2004

(54) SILICA-BASED OPTICAL DEVICE FABRICATION

(75) Inventor: Michael Bazylenko, Sydney (AU)

(73) Assignee: Redfern Integrated Optics PTY LTD, Sydney (AU)

( * ) Notice: Subject to any disclaimer, the term of this patent is extended or adjusted under 35 U.S.C. 154(b) by 153 days.

(21) Appl. No.: 09/986,250

(22) Filed: Nov. 8, 2001

(65) Prior Publication Data

US 2002/0064897 A1 May 30, 2002

(30) Foreign Application Priority Data

Nov. 29, 2000 (AU) .............................................. PR1782

(51) Int. Cl.[7] .............................................. H01L 21/00
(52) U.S. Cl. .............................. 438/31; 438/29; 438/23; 438/109; 438/25; 438/27; 438/65; 438/67; 438/22; 385/14; 385/15; 385/49; 385/129; 385/130; 385/131; 384/141
(58) Field of Search .......................... 438/29, 23, 109, 438/25, 27, 65, 67, 31, 22; 385/14, 15, 49, 129, 130, 131, 141

(56) References Cited

U.S. PATENT DOCUMENTS

| | | | | |
|---|---|---|---|---|
| 4,946,251 A | * | 8/1990 | Ashwell et al. | 385/141 |
| 4,969,712 A | * | 11/1990 | Westwood et al. | 385/14 |
| 5,700,382 A | * | 12/1997 | Splett | 216/24 |
| 5,790,583 A | * | 8/1998 | Ho | 372/92 |
| 5,878,070 A | * | 3/1999 | Ho et al. | 372/92 |
| 6,028,977 A | * | 2/2000 | Newsome | 385/147 |
| 6,154,582 A | * | 11/2000 | Bazylenko et al. | 385/14 |
| 6,311,004 B1 | * | 10/2001 | Kenney et al. | 385/130 |
| 6,392,233 B1 | * | 5/2002 | Channin et al. | 250/338.1 |

FOREIGN PATENT DOCUMENTS

| | | |
|---|---|---|
| EP | 0735160 | 8/2000 |
| GB | 2312525 | 10/1997 |
| WO | WO 00/68718 | 11/2000 |

* cited by examiner

Primary Examiner—Matthew Smith
Assistant Examiner—V. Yevsikov

(57) ABSTRACT

A method and apparatus for fabricating silica-based waveguide devices on a substrate using a low temperature PECVD process using a TEOS source material for depositing waveguide layers containing silica, the apparatus being arranged, in use, in a manner such that a liquid source material containing silicon is used during the PECVD.

23 Claims, 3 Drawing Sheets

SILICA-BASED OPTICAL DEVICE FABRICATION

TECHNICAL FIELD

The present invention relates broadly to fabrication of silica-based optical devices. Background of the Invention

BACKGROUND OF THE INVENTION

In optical devices it is desirable to merge silica-based optical structures with processing elements in integrated form. This can enable, for example, chips to be provided which interface between active and passive optical elements.

One problem to be overcome in the fabrication of such devices is the development of low temperature deposition processes which allow silica-based waveguides to be monolithically integrated with active signal processing elements based on materials are unable to withstand high temperatures.

Low temperature plasma-enhanced chemical vapour deposition (PECVD) techniques allow for optical processing elements to be directly incorporated on a substrate, without damaging the processing elements. However, there can be significant tradeoffs to using conventional PECVD techniques, including those adapted for low temperature operation. In conventional PECVD techniques, nitrous oxides and silane are utilised. Such elements often result in a material having a high level of absorption at a wavelength around 1.5 $\mu$m. In order to remove the chemical constituents which give rise to this loss, it is necessary to heat the deposited material to higher temperatures, thereby eliminating the advantages provided by the low temperature deposition process.

SUMMARY OF THE INVENTION

At least preferred embodiments of the present invention seek to provide a modified PECVD process which seek to ameliorate the aforementioned disadvantages.

In accordance with a first aspect of the present invention, there is provided, a method of fabricating a silica-based photonic waveguide device, the method comprising the step of depositing waveguide layers containing silica using PECVD, wherein a liquid source material containing silicon is used during the PECVD deposition process and at least one layer having low optical losses in the infra-red region is produced.

The waveguide layers may be deposited at a low process temperature, preferably below 500° C.

The PECVD may be carried out in the absence of nitrogen and nitrogen-containing source materials.

Preferably, the PECVD is carried out in an ambient comprising a mixture of oxygen and vapour from the liquid source material.

Preferably, the waveguide device is formed without high temperature thermal annealing. Where the method includes a step of annealing the device, the annealing is preferably carried out at a temperature below 800° C.

In one embodiment, the liquid source material comprises tetraethoxysilane (TEOS).

The method may further comprise the step of controlling a refractive index contrast within the deposited waveguide layer by addition of a dopant material during the PECVD. The dopant material may be provided in a gaseous or liquid form. In one embodiment, the dopant material may comprise tetramethylgermaniun (TMG).

The method may further comprise a step of controlling at least one optical property of the waveguide layer by controlling ion-bombardment of each deposited waveguide layer during the PECVD process. The ion-bombardment may be controlled by controlling an electrode spacing during the PECVD. The ion-bombardment may further or alternatively be controlled by controlling the frequency of RF power applied to electrodes used during the PECVD process. In a preferred embodiment the step of controlling at least one optical property comprises simultaneously applying a lower frequency component of RF power and an upper frequency component of RF power to electrodes used during the PECVD, each component having a different frequency, and controlling ion bombardment by controlling the power of the lower frequency RF component so as to control the or each optical property.

The optical property which is controlled through the ion-bombardment may comprise a refractive index of the waveguide layer or stress-induced birefringence in the waveguide layer.

The method may further comprise the step of using the ion-bombardment to control stress in the deposited waveguide layer.

The method may further comprise the step of using the ion-bombardment to minimise curvature of a wafer onto which the waveguide layer is being deposited.

In accordance with a further aspect of the present invention there is provided an optical waveguide device incorporating a silica-based waveguide layer deposited using the method of the present invention.

In accordance with a further aspect of the present invention there is provided a method of fabricating a silica-based waveguide device, the method comprising the step of depositing waveguide layers containing silica using PECVD, wherein a liquid source material containing silicon is used during the PECVD.

It has been found by the applicant that in at least preferred embodiments, the present invention can facilitate the manufacture of silica-based waveguide devices at low deposition temperatures, without a requirement for using a high density PECVD process such as hollow-cathode PECVD.

BRIEF DESCRIPTION OF THE DRAWINGS

Preferred forms of the present invention will now be described, by way of example only, with reference to the accompanying drawings in which.

DETAILED DESCRIPTION OF THE EMBODIMENTS

In the preferred embodiment, a low temperature PECVD process is provided which utilizes non-nitrogen source material in the deposition process for fabricating an optical device. In particular, a liquid source material containing tetraethoxysilane (TEOS) has been found to be highly suitable.

Whilst the preferred embodiment is described with reference to an example discussion of an electro-optic device, it will be evident to persons skilled in the art that the method of the preferred embodiment is not limited thereto but extends to most forms of fabricated optical devices including those not reliant on an electro optic effect.

Figure 1:
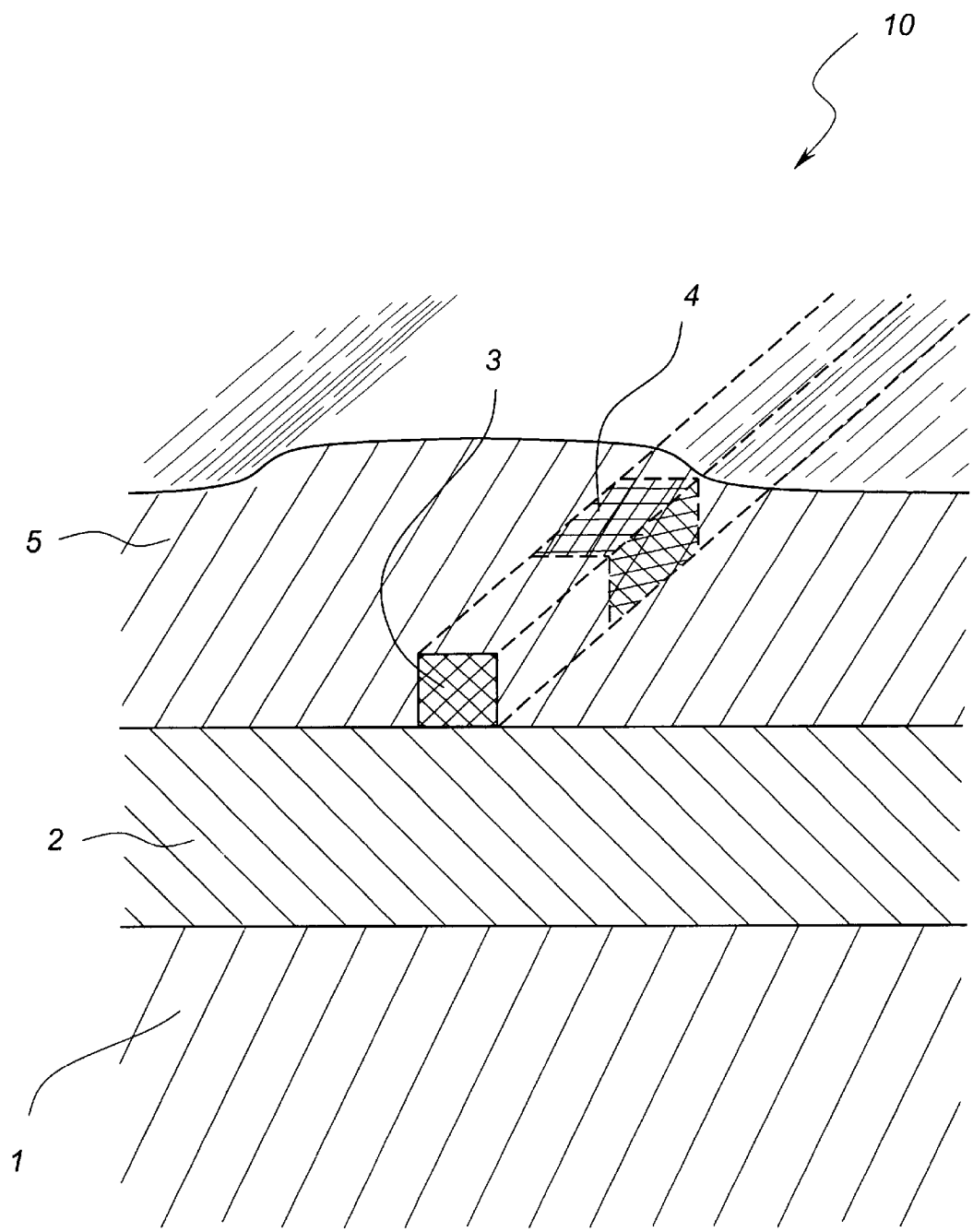
FIG. 1 illustrates an example optical waveguide on a silicon substrate.

In FIG. 1, there is illustrated, partly in section, a portion of a planar optical waveguide device 10 formed on a silicon substrate 1. The waveguide device comprises a buffer layer 2 formed on the substrate 1, an optical waveguide core 3 formed on the buffer layer and having an active region 4, and a cladding layer 5 deposited over the waveguide core 3 and active region 4.

It will be appreciated by a person skilled in the art that the present invention is not limited to the theoretical device 10 illustrated in FIG. 1. Rather, the present invention is applicable to any device which incorporates a silica-based waveguide and an optical processing element. Furthermore, the processing element may be incorporated anywhere within the device. For example, in the substrate, in waveguide channels, in between waveguide channels, above waveguide channels, etc.

The active region 4 could comprise one or more of a number of different materials, including:
 (a) Electrooptic ferroelectric polycrystaline layers (PLT, PLZT) etc;
 (b) low temperature phosphate glass for erbium doped planar amplifiers;
 (c) silica deposited for its own properties such as birefringence; and
 (d) other temperature sensitive materials that cant be thermally annealed.

In the preferred embodiment of the present invention, a PECVD process for the fabrication of an optical circuit in a multilayer silica structure onto a silicon substrate is used. Oxygen is used as the oxidising agent, in substitution for nitrous oxide as used in conventional PECVD reactors. The substitution of the nitrous oxide avoids high transmission losses in the wavelength range of 1.50 to 1.55 $\mu$m, which is believed to be attributable to N—H bonds present in deposited films where a nitrogen containing oxidant is used.

TEOS is used as a liquid source material for silicon in the formation of the silica-based structure (formed in the presence of oxygen as the oxidising agent).

Figure 2:
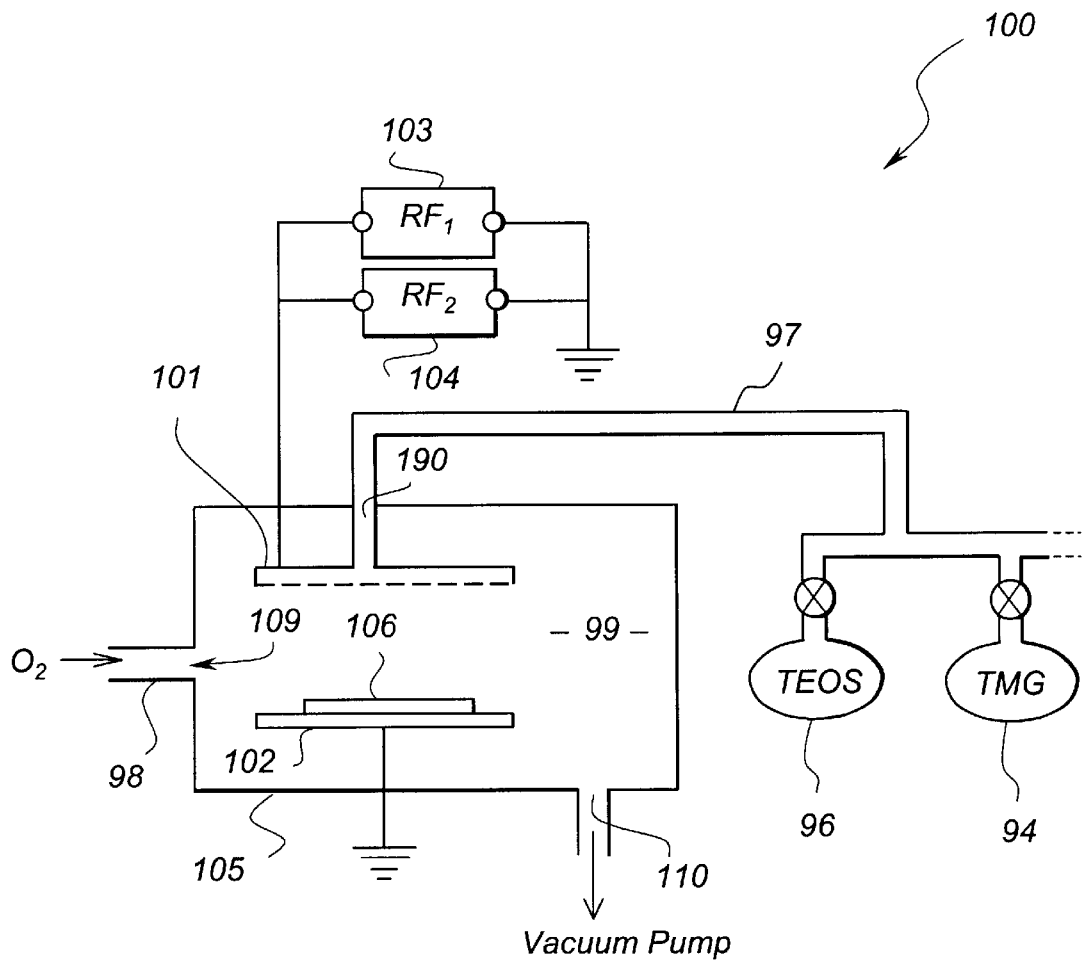
FIG. 2 illustrates schematically the PECVD deposition process.

In FIG. 2, there is illustrated in schematic form a conventional PECVD chamber for use with the preferred embodiment for the deposition of optical waveguide structures. Two opposing electrodes 101, 102 form a circuit with two RF power supply 103, 104 connected in parallel. A diode discharge is generated between the two electrodes.

The deposition chamber 99 further comprises a vacuum chamber wall 105, with pump port 110 leading to a vacuum pump (not shown). A substrate wafer 106 is supported on the lower electrode 102. For example, the waveguide device formed on the substrate may be the same as the device shown in FIG. 1.

Oxygen is delivered at a relatively high pressure in a gas-feed pipe 98 and introduced into the deposition chamber 99 through port 109 in a sidewall of the deposition chamber 99. A further pipe 97 is utilised to feed vapour from a source of liquid tetraethoxysilane, which is contained in a vessel 96.

It will be appreciated by a person skilled in the art that provisions for valves are made in both the feed pipes 98, 97, but those are not illustrated for simplicity.

For providing a dopant during the deposition of silica-based films on the substrate wafer 106, tetramethylgermaniun is provided in a second vessel 94 which is also connected to the feed pipe 97.

The RF power supplies 103, 104 are designed to operate at different frequencies. In one embodiment, one of the power supplies 103 has a fixed frequency of 13.56 MHz and the other power supply 104 has a fixed lower frequency, in this embodiment 450 kHz. By controlling the power supplied by the lower frequency power supply 104 relative to the other power supply 103 during the PECVD, the level of ion bombardment at the surface of a growing waveguide layer on the substrate 106 can be controlled. It has been shown that through controlling ion-bombardment during the PECVD process, optical properties of the deposited waveguide layer can be controlled. Examples of the optical properties which can be controlled through the ion-bombardment include the refractive index of the waveguide layer and stress-induced birefringence in the waveguide layer.

Ion bombardment of a growing film is also known to influence the stress in the film. Thus, since the film stress is related to wafer curvature, ion bombardment may be used to minimise the curvature of a wafer 106 onto which a waveguide layer is deposited.

Alternative ways to control ion bombardment during the PECVD in the deposition chamber include controlling the spacing between electrodes 101, and 102, or by controlling the frequency of the RF power supply 103 only, in which case no lower frequency supply signal from the power supply 104 needs to be provided.

Figure 3:
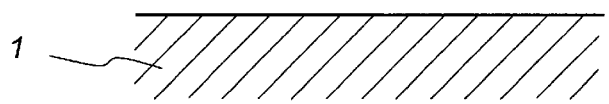
FIGS. 3 to 7 show cross-sectional views along the length of a waveguide device at various stages of fabrication.
Figure 4:
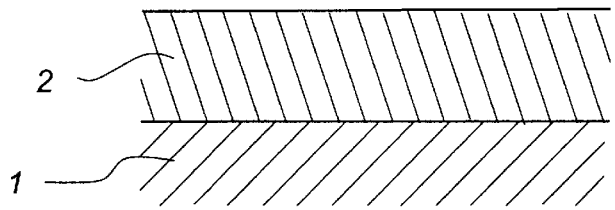
Figure 5:
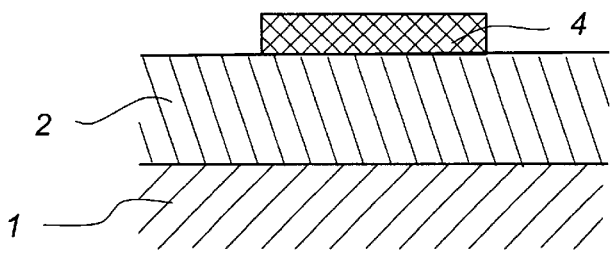
Figure 6:
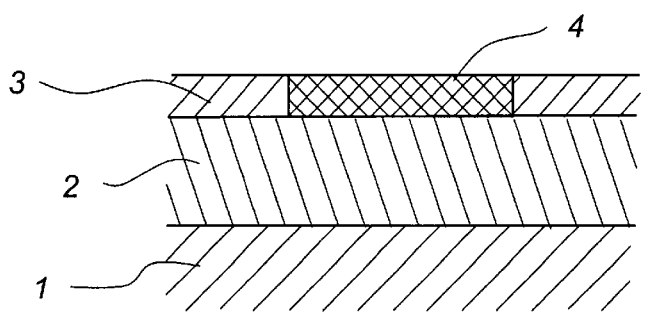
Figure 7:
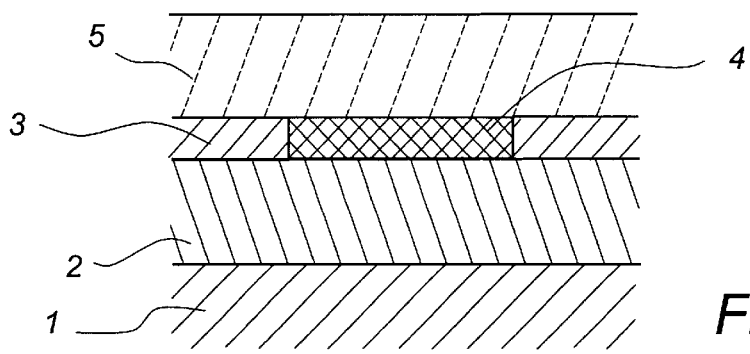

The present invention can be utilised for the preparation of monolithically-integrated silica-based devices having optical components fabricated using a TEOS source material. For example, in FIGS. 3 to 6 there is shown a silica-based optical waveguide device of the type shown in FIG. 1, at five stages of the manufacturing process. Initially, a wafer 1 is provided as shown in FIG. 3. Subsequently, a buffer layer 2 is deposited on the wafer as shown in FIG. 4. As shown in FIG. 5, a passive device layer, such as a germanium-doped layer, is then deposited using the TEOS and TMG sources, masked and etched, forming a waveguide core 4 with a channel geometry. Next a subsequent waveguide layer is deposited, masked and etched as shown in FIG. 6 forming a second waveguide core 3 which is butt-coupled to the first waveguide core 4. Finally a cladding layer 5 is deposited over cores 4 and 5 as shown in FIG. 7.

Further, through variation of the PECVD frequency or deposition rate, variations in end product are likely so that the frequency or deposition rate can be adjusted to achieve a homogeneous material with low porosity, low optical scattering characteristics, low hydroscopicity, and is environmentally-stable.

It will be appreciated by a person skilled in the art that numerous variations and/or modifications may be made to the invention as shown the specific embodiments without departing from the spirit or scope of the invention as broadly described. The present embodiments are, therefore, to be considered in all respects as illustrative and not restrictive. For example, it will be appreciated that processes similar to the general processes described herein can be utilised to fabricate any integrated combination of optical devices. The processed disclosed herein can also be used to manufacture optical components on their own, and therefore the present invention is not limited to the fabrication of integrated optical device.

In the claims that follow and in the summary of the invention, except where the context requires otherwise due to express language or necessary implication, the word "comprising" is used in the sense of "including", i.e. the feature specified may be associated with further features in various embodiments of the invention.

What is claimed is:

1. A method of fabricating a silica-based waveguide photonic device, the method comprising the step of depositing waveguide layers containing silica using PECVD, wherein a liquid source material containing silicon is used during the PECVD deposition process, the source material not comprising $SiCl_4$, silane, or a derivative of silane, and at least one as-deposited layer having low optical losses in the infra-red region is produced.

2. A method as claimed in claim 1 wherein said waveguide layers are deposited using a low temperature deposition process.

3. A method as claimed in claim 2 wherein the deposition process temperature is below 500 degrees Celsius.

4. A method as claimed in claim 1, wherein the PECVD is carried out in the absence of nitrogen and nitrogen-containing source materials.

5. A method as claimed in claim 1, wherein said waveguide device is formed without high temperature thermal annealing of said waveguide layers.

6. A method as claimed in claim 1, wherein said waveguide device is formed without being annealing at temperatures of 800 degrees Celsius or higher.

7. A method as claimed in claim 1, wherein the PECVD is carried out in an ambient comprising a mixture of oxygen and vapour from the liquid source material.

8. A method as claimed in claim 1, wherein the liquid source material comprises tetraethoxysilane.

9. A method as claimed in claim 1, wherein the method further comprises a step of controlling a refractive index contrast between the deposited waveguide layers by incorporating a dopant material during the PECVD.

10. A method as claimed in claim 9, wherein the dopant material is provided in a gaseous or liquid form.

11. A method as claimed in claim 9, wherein the dopant material comprises tetramethylgermaniun.

12. A method as claimed in claim 1, wherein the method further comprises a step of controlling at least one optical property of at least one of the waveguide layers by controlling ion bombardment of the deposited waveguide layer during the PECVD process.

13. A method as claimed in claim 12, wherein the ion bombardment is controlled by controlling a spacing between electrodes used during the PECVD.

14. A method as claimed in claim 12, wherein the ion bombardment is controlled by controlling a frequency of RF power applied to electrodes used during the PECVD process.

15. A method as claimed in claim 12, wherein the step of controlling at least one optical property comprises: simultaneously applying a lower frequency component of RF power and an upper frequency of RF power to electrodes used during the PECVD, each component having a different frequency; and controlling ion bombardment by controlling the power of the lower frequency component so as to control the or each optical property.

16. A method as claimed in claim 12, wherein the or each optical property which is controlled through the ion bombardment is selected from a group comprising a refractive index of the waveguide layer and a stress-induced birefringence in the waveguide layer.

17. A method as claimed in claim 1, further comprising a step of using ion bombardment during the PECVD to control a level of stress in each waveguide layer.

18. A method as claimed in claim 1, further comprising a step of using ion bombardment during the PECVD to minimise curvature of a wafer onto which the waveguide layer is being deposited.

19. A method as claimed in claim 1, wherein a frequency of RF power used in the PECVD or a deposition rate of the PECVD is controlled to achieve a homogeneous material with low porosity and low optical scattering characteristics.

20. A method as claimed in claim 1, wherein a frequency of RF power used in a PECVD or a deposition rate of the PECVD is controlled to achieve a product which has a low hydroscopicity, and is environmentally-stable.

21. A method of fabricating a silica-based waveguide photonic device, the method comprising the step of depositing waveguide layers containing silica using PECVD, wherein a liquid source material containing silicon is used during the PECVD deposition process, the liquid source material comprising tetraethoxysilane, and at least one as-deposited layer having low optical losses in the infra-red region is produced.

22. A method as claimed in claim 21, wherein the step of depositing waveguide layers further comprises using a process temperature which is below 500° C.

23. A method as claimed in claim 21, wherein said waveguide is formed without being annealed at temperatures of 800° C. or higher.

* * * * *